United States Patent
Hsieh et al.

(10) Patent No.: US 9,140,976 B2
(45) Date of Patent: Sep. 22, 2015

(54) MASK DESIGN WITH OPTICALLY ISOLATED VIA AND PROXIMITY CORRECTION FEATURES

(75) Inventors: Chih-Chang Hsieh, Hsinchu (TW); Shih-Hung Chen, ChuTung Village (TW); Hang-Ting Lue, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 315 days.

(21) Appl. No.: 13/619,124

(22) Filed: Sep. 14, 2012

(65) Prior Publication Data
US 2014/0078804 A1  Mar. 20, 2014

(51) Int. Cl.
G03F 1/00  (2012.01)
G03F 1/36  (2012.01)
G11C 5/06  (2006.01)
G03F 1/38  (2012.01)
G11C 5/02  (2006.01)

(52) U.S. Cl.
CPC .................. *G03F 1/36* (2013.01); *G11C 5/063* (2013.01); *G03F 1/38* (2013.01); *G11C 5/025* (2013.01)

(58) Field of Classification Search
CPC .............. G03F 1/36; G03F 1/38; G11C 5/063; G11C 5/025
See application file for complete search history.

(56) References Cited

U.S. PATENT DOCUMENTS

| | | | |
|---|---|---|---|
| 5,242,770 A * | 9/1993 | Chen et al. | 430/5 |
| 5,447,810 A * | 9/1995 | Chen et al. | 430/5 |
| 6,745,380 B2 * | 6/2004 | Bodendorf et al. | 716/53 |
| 6,803,155 B2 * | 10/2004 | Dulman et al. | 430/5 |
| 6,887,633 B2 * | 5/2005 | Tang | 430/30 |
| 7,487,489 B2 * | 2/2009 | Granik | 716/51 |
| 7,512,928 B2 * | 3/2009 | Jessen et al. | 716/53 |
| 7,521,157 B2 * | 4/2009 | Wallace et al. | 430/5 |
| 7,548,302 B2 * | 6/2009 | Bleeker et al. | 355/67 |
| 7,555,736 B2 * | 6/2009 | Cadouri | 716/106 |
| 7,674,703 B1 * | 3/2010 | Schiwon et al. | 438/618 |
| 7,745,067 B2 * | 6/2010 | Blatchford et al. | 430/5 |

(Continued)

OTHER PUBLICATIONS

Vasek J. et al., "Identification of Process Window Limiting Stuctures by Design-Based Defect Binning," Advanced Semiconductor Manufacturing Conference, 2007, IEEE/SEMI pp. 153-156.

(Continued)

*Primary Examiner* — Naum B Levin
(74) *Attorney, Agent, or Firm* — Kenta Suzue; Haynes Beffel & Wolfeld LLP

(57) ABSTRACT

A lithography mask and method for manufacturing such mask that includes optically isolated via features and proximity correction features. The via patterns that include via features that define vias are positioned on the mask in rows and columns with a row and a column pitch between each row and column on the mask. The via patterns are positioned such that via features that are in adjacent columns are separated by at least one intervening row between them. The via patterns can also be positioned such that the via patterns that are in adjacent rows are separated by at least one intervening column between them. As a result, the via feature of each via pattern and the associated optical proximity correction features that are positioned around each via feature do not overlap with the optical proximity correction features and the via features of the surrounding via patterns.

15 Claims, 9 Drawing Sheets

(56) References Cited

U.S. PATENT DOCUMENTS

| | | | |
|---|---|---|---|
| 7,882,480 B2* | 2/2011 | Ye et al. | 716/53 |
| 8,501,376 B2* | 8/2013 | Hung et al. | 430/30 |
| 8,856,693 B2* | 10/2014 | Cheng et al. | 716/52 |
| 2007/0059609 A1 | 3/2007 | Wu et al. | |
| 2009/0191468 A1* | 7/2009 | Crouse et al. | 430/5 |

OTHER PUBLICATIONS

Allgair J. et al., "Characterization of the optical proximity correction features," Metrology, Inspection, and Process Control for Microlithography XV, ed. N. Sullivan, 2001, vol. 4344, pp. 200-207.

CN Application No. 93111017 filed Apr. 20, 1993 consisting of 30 pages.

* cited by examiner

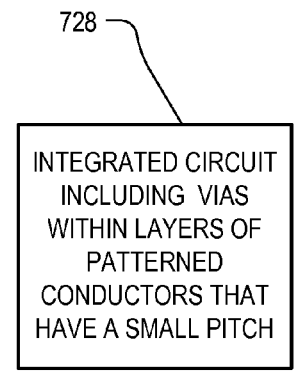
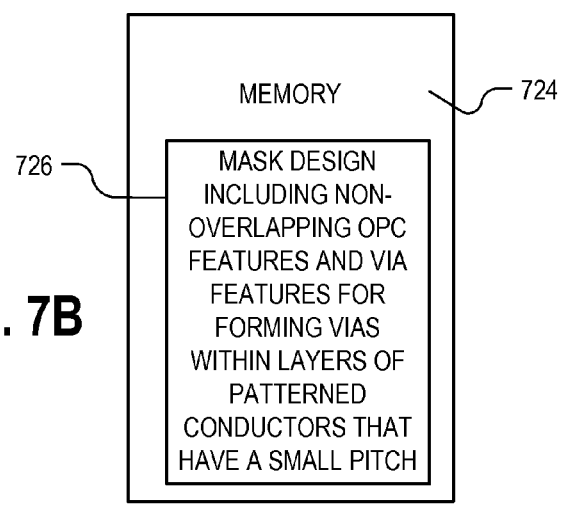
FIG. 7B
FIG. 7C
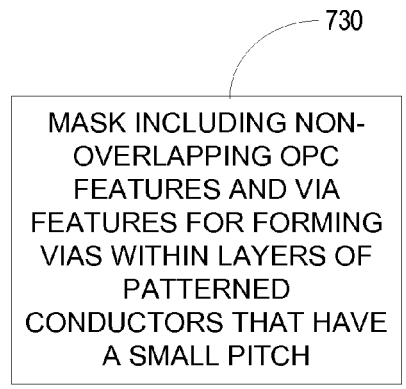
FIG. 7D

MASK DESIGN WITH OPTICALLY ISOLATED VIA AND PROXIMITY CORRECTION FEATURES

BACKGROUND OF THE INVENTION

1. Field of the Invention

The present invention relates to photolithography techniques and photolithographic masks and methods for fabricating such masks.

2. Description of Related Art

Dimensions of integrated circuit continue to become smaller in order to fit more circuitry in a given area. Features of integrated circuits that must continue to shrink include patterned conductor layers in which "interconnects" are formed for parts of the integrated circuit. As a result the shrinking node sizes on integrated circuits, the distance between conductors in the layers of patterned conductors has also decreased. A via is a hole through a layer or layers of material in an integrated circuit, which is typically filled with a conductor, sometimes called a plug, that can provide an interlayer connector between or among the layers of patterned conductors. So, as the distance between patterned conductors has decreased, there is increased pressure to make vias in smaller and smaller pitches.

Vias can be created through lithography, in which a group of via features on a mask defines an optical projection onto a wafer used in processes to form the vias on the wafer according to the pattern in the mask. With decreased via sizes, optical proximity correction (hereinafter OPC) features are included with the via features in the mask.

A via pattern on a mask can therefore include both the via feature and any OPC feature that is associated with such via feature. While the use of OPC features reduces distortion, such use also increases the area of each via pattern on the mask. Such increased area of each via pattern conflicts with the decreasing spacing between vias on the circuits being manufactured.

It is therefore desirable to provide technology which supports the use of OPC features despite the decreasing spacing between vias.

SUMMARY OF THE INVENTION

The present invention provides a lithographic method and mask design wherein the via features and the associated OPC features are optically isolated from each other. The via feature and associated OPC features form a via pattern in the mask. Such via patterns are positioned in a mask such that the OPC features do not overlap.

An area of a mask with via patterns has neighboring column positions and neighboring row positions where a via pattern may be located. Positions of via patterns are determined by particular intersections of the neighboring column positions and the neighboring row positions. The column positions and row positions on the mask can correspond to the positions at which an interlayer connector can be formed in a via making connection between layers of patterned conductor layers of parts of the integrated circuit. The columns and rows have a column pitch and a row pitch. Via patterns include via features, and associated OPC features for such via features. A via pattern has a length that is greater than the column pitch of the neighboring column positions on the mask, and a width that is greater than the row pitch of the neighboring row positions on the mask. The via patterns can be positioned on the mask such that the via patterns in adjacent columns have at least one intervening row in between the rows in which such via patterns are positioned. Alternatively, the via patterns can be positioned on the mask such that the via patterns in adjacent rows have at least one intervening column in between the columns in which such via patterns are positioned.

In one aspect, the via patterns can be positioned such that there is an integer difference D that is the magnitude of the difference between a first row number of a row position of the first via pattern and a second row number of a row position of the second via pattern, wherein such difference is equal to the via row pitch integer of R rows. Via patterns in adjacent column positions can be positioned such that there is at least one intervening row between the first and second via patterns. Alternatively, via patterns can be positioned such that there is an integer difference D that is the magnitude of the difference between a first column number of a column position of the first via pattern and a second column number of a column position of the second via pattern, wherein such difference is equal to the via column pitch integer of C columns. Via patterns in adjacent row positions can be positioned such that there is at least one intervening column between the first and second via patterns.

The multiple via patterns can be defined in a unit cell on the mask that can be repeated to create the plurality of via patterns in the mask. Each unit cell includes a number of N via patterns. The via patterns are positioned in the mask such that when the number of N via patterns is divided by the previously described difference D, that is either the row pitch integer of R rows or the column pitch integer of C columns, there is a non-zero remainder. The non-zero remainder indicates that the via patterns across the multiple copies of the unit cell have at least one or both of an intervening row and an intervening column between proximate via patterns.

In one aspect, each via pattern defines an area on a plane of the mask. The via pattern can be of dimensions such that a length of the area is equal to the product of the neighboring integer of the square root of the number of N via features and corresponding via patterns within the unit cell and the column pitch or the row pitch of the columns or rows within the unit cell. The neighboring integer is equal to at least one of the via row pitch integer and the column pitch integer. In another aspect, the OPC features include scattering bars. In another aspect, one of the via patterns on the mask defines more than one corresponding via when the mask is illuminated.

Other aspects and advantages of the present invention can be seen on review of the drawings, the detailed description and the claims, which follow.

BRIEF DESCRIPTION OF THE DRAWINGS

FIGS. 7A and 7B illustrate a computer system and a memory for creating the mask that creates an arrangement of vias in an integrated circuit that has patterned conductor layers that have a small pitch, shown in FIG. 7C, such that there are non-overlapping via patterns on the mask, shown in FIG. 7D.

DETAILED DESCRIPTION

A detailed description of embodiments of the present invention is provided with reference to the FIGS. 1-8.

Figure 1:
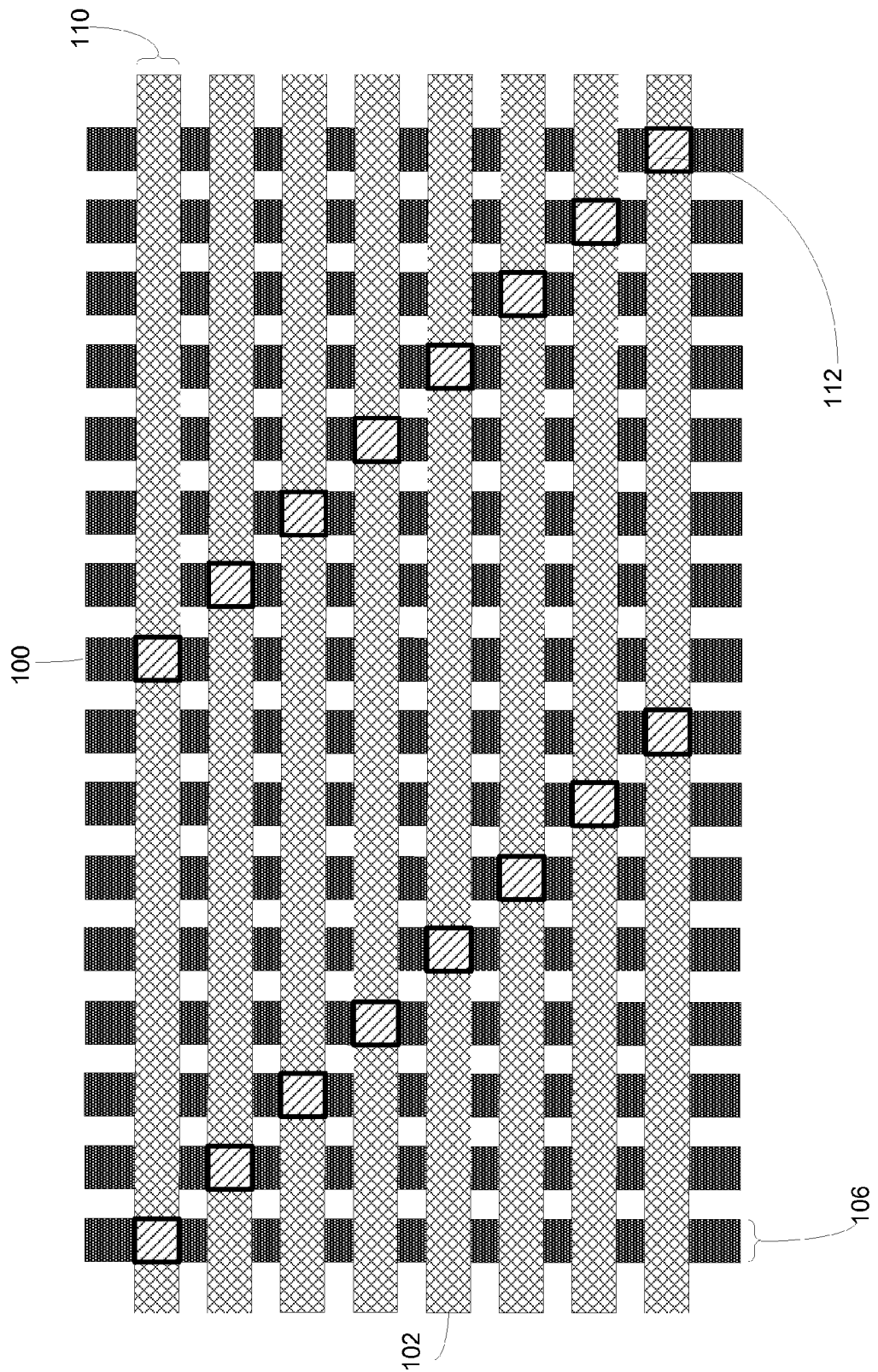
FIG. 1 illustrates a standard arrangement of vias relative to layers of patterned conductor layers for an array of memory cells.

FIG. 1 illustrates a standard arrangement of vias relative to layers of patterned conductor layers for an array of memory cells. The first layer of patterned conductors, includes a plurality of parallel conductors 100 acting as interconnects. The conductors 100 are lines of a conductive material, such as a metal or doped semiconductor. The second layer of patterned conductors includes a plurality of parallel conductors 102. The conductors 102 are lines of a conductive material, such as a metal or doped semiconductor. In FIG. 1, the first layer of parallel conductors 100 is a lower layer than the second layer of parallel conductors 102. In another embodiment, the first layer of parallel conductors 100 is a higher layer than the second layer of parallel conductors 102.

The via arrangement includes a plurality of vias 112. The vias 112 are holes that extend through the layers of patterned conductors that form part of an integrated circuit. The via is filled with a plug that acts as an interlayer connector that connects the layers of patterned conductors. Through such connection, electrical contacts are made between different layers of patterned conductors, such as different layers of parallel conductors. The number of patterned conductor layers that are connected by a plug that is filled in the via can be two or more. The patterned conductor layers can be adjacent layers separated by a single layer of dielectric, or by multiple layers (e.g., layers of dielectric and/or interconnect). The vias can be formed at the intersections of the patterned conductors of the different layers of patterned conductor layers. For example, a via is formed at the intersection of a first layer of patterned conductors and a second layer of patterned conductors when viewed from the top or the bottom, as in FIG. 1. The via can be any shape that is suitable for forming a hole that can be filled with a plug.

Figure 2A:
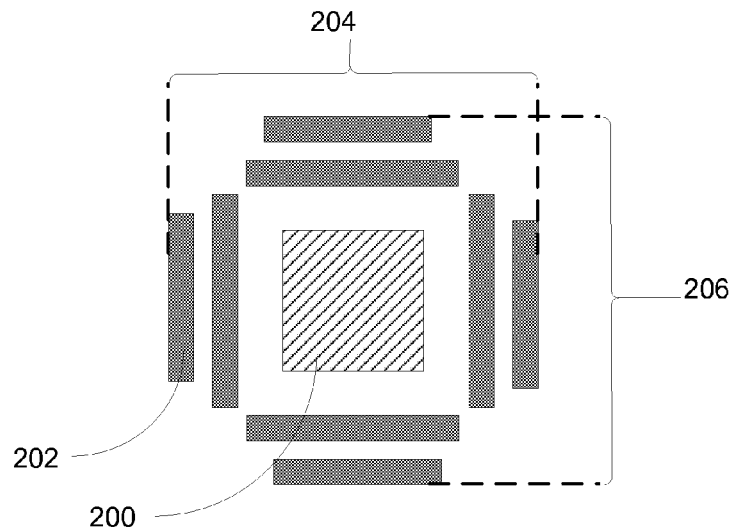
FIG. 2A illustrates a single via feature and associated OPC features that combine to form a single via pattern that makes up the plurality of via patterns on a mask.

FIG. 2A shows a single via feature 200 and associated OPC features 202 that together form a single via pattern out of the plurality of via patterns in a mask and are used to create at least one via. The via pattern can be used to form a via lithographically, with positive or negative photoresist for example. For example, the via feature 200 of the via pattern exposes a part of a photoresist layer, which acts in later processes to define a portion in an interlayer dielectric that is removed by etching to create the via. In the shown embodiment a via pattern defines a single via on the wafer; in other embodiments a via pattern defines multiple vias on the wafer. OPC features 202 are associated with a via feature to form the via pattern. The OPC features 202 reduce distortion caused by diffraction and interference. As a result, the OPC features reduce distortion of the via features despite the reduced wavelength of electromagnetic radiation that illuminates the mask. The OPC features are sub resolution in that they are smaller than the critical dimension of the exposure apparatus, such that the OPC features themselves are not developed in the photoresist layer. The OPC features can be of any shape that reduces distortion. The OPC features can be a plurality of scattering bars that are positioned around the sides of the via feature.

Figure 2B:
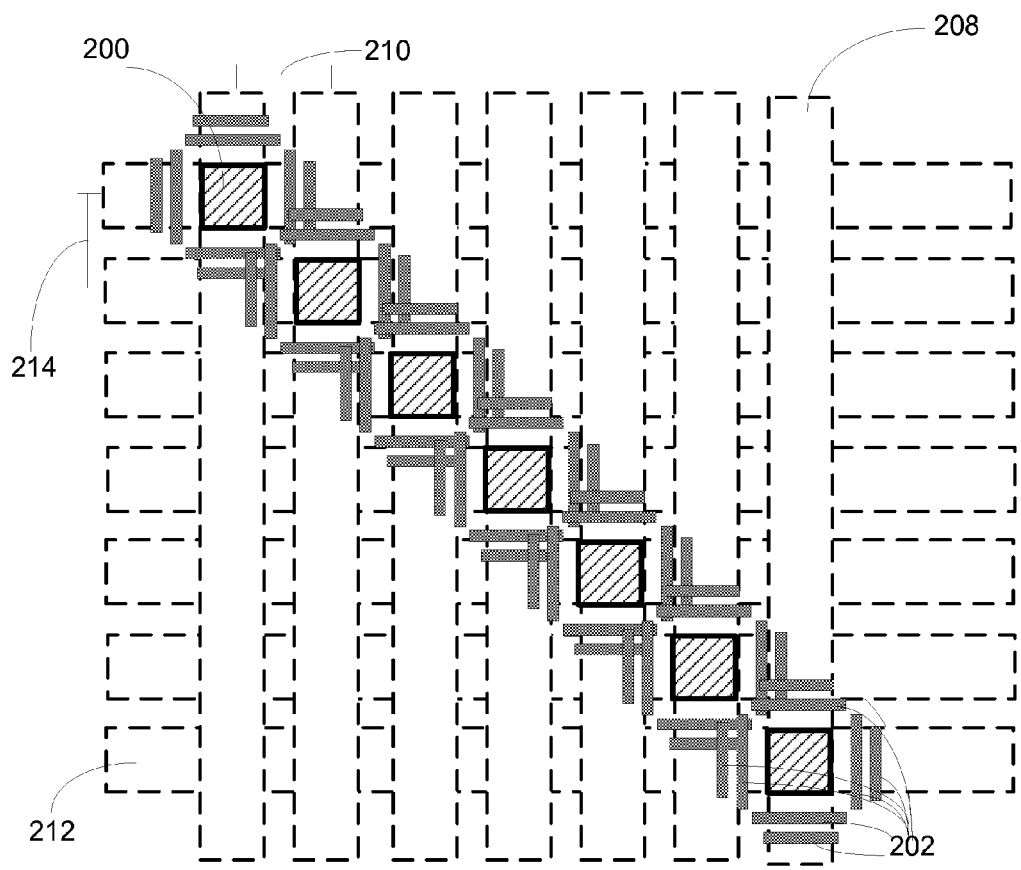
FIG. 2B illustrates a problem with positioning the via patterns in the mask to create the via arrangement shown in FIG. 1.

FIG. 2B illustrates a plurality of via patterns on a mask that create the via arrangement shown in FIG. 1. The mask includes neighboring column positions 208 where a via pattern can be positioned on the mask. Such column positions 208 can correspond to the positions of the conductors in the layers of patterned conductors. Adjacent columns have a column pitch 210. The column pitch can 210 be, as is shown in FIG. 2B, the magnitude of the distance between the center axis of a first column and the center axis of a second adjacent column. Alternatively, the column pitch can be the magnitude of the distance between the corresponding sides of adjacent columns—for example, the right sides of adjacent columns, or the left sides of adjacent columns. In an embodiment with a column pitch that varies for a set of neighboring column positions in the plurality of via patterns on the mask, there is a column pitch. In another embodiment the column pitch can be the same as the column pitch for a set of neighboring column positions in the plurality of via patterns on the mask.

The mask includes neighboring row positions 212 where a via pattern can be positioned on the mask. Such row positions 212 can correspond to the positions of the patterned conductors in the layers of patterned conductors. Adjacent rows are spaced apart by a row pitch 108. The arrangement of the rows define a row pitch 214. The row pitch 214 can be, as is shown in FIG. 2B, the magnitude of the distance between the center axis of a first row and the center axis of a second row. Alternatively, the row pitch can be the magnitude of the distance between corresponding sides of adjacent rows—for example, the top sides of rows, and the bottom sides of rows. In an embodiment with a row pitch varies for a set of neighboring row positions in the plurality of via patterns on the mask, there is a row pitch. In another embodiment the row pitch can be the same as the row pitch for a set of neighboring row positions in the plurality of via patterns on the mask.

As shown in FIG. 2A, the via pattern which includes the via feature 200 and OPC features 202, have a length 204 and a width 206. A plurality of via patterns with a length that varies across the plurality of via patterns can have a maximum length, and a plurality of via patterns with a width that varies across the plurality of via patterns can have a maximum width. In another embodiment the maximum length can be the same as the maximum length and the maximum width for a set of via patterns. As the via patterns in the mask are positioned closely together, the row positions and column positions in the mask are also positioned closely together. As a result, the length 204 of the via pattern is greater than the column pitch 210. Similarly, the width 206 of the via pattern is greater than the row pitch 214.

FIG. 2B also illustrates a problem with positioning the via patterns on a mask to create the via arrangement shown in FIG. 1. As previously described, the parallel interconnects and the vias are positioned closely to each other such that a via pattern including a via feature and associated OPC features have a length and a width that is greater than the column pitch and row pitch of the neighboring row positions and neighboring column positions on the mask. As a result, when a via pattern is positioned close to another via pattern in order to create the via arrangement shown in FIG. 1, OPC features will overlap, as is shown in FIG. 2B. The overlapping of the OPC features can have negative consequences on the imaged via pattern on the photoresist layer. The overlapping of the OPC features can cause the OPC features to not function properly, such that they do not reduce distortion of the vias that are imaged into the photoresist layer.

Figure 3:
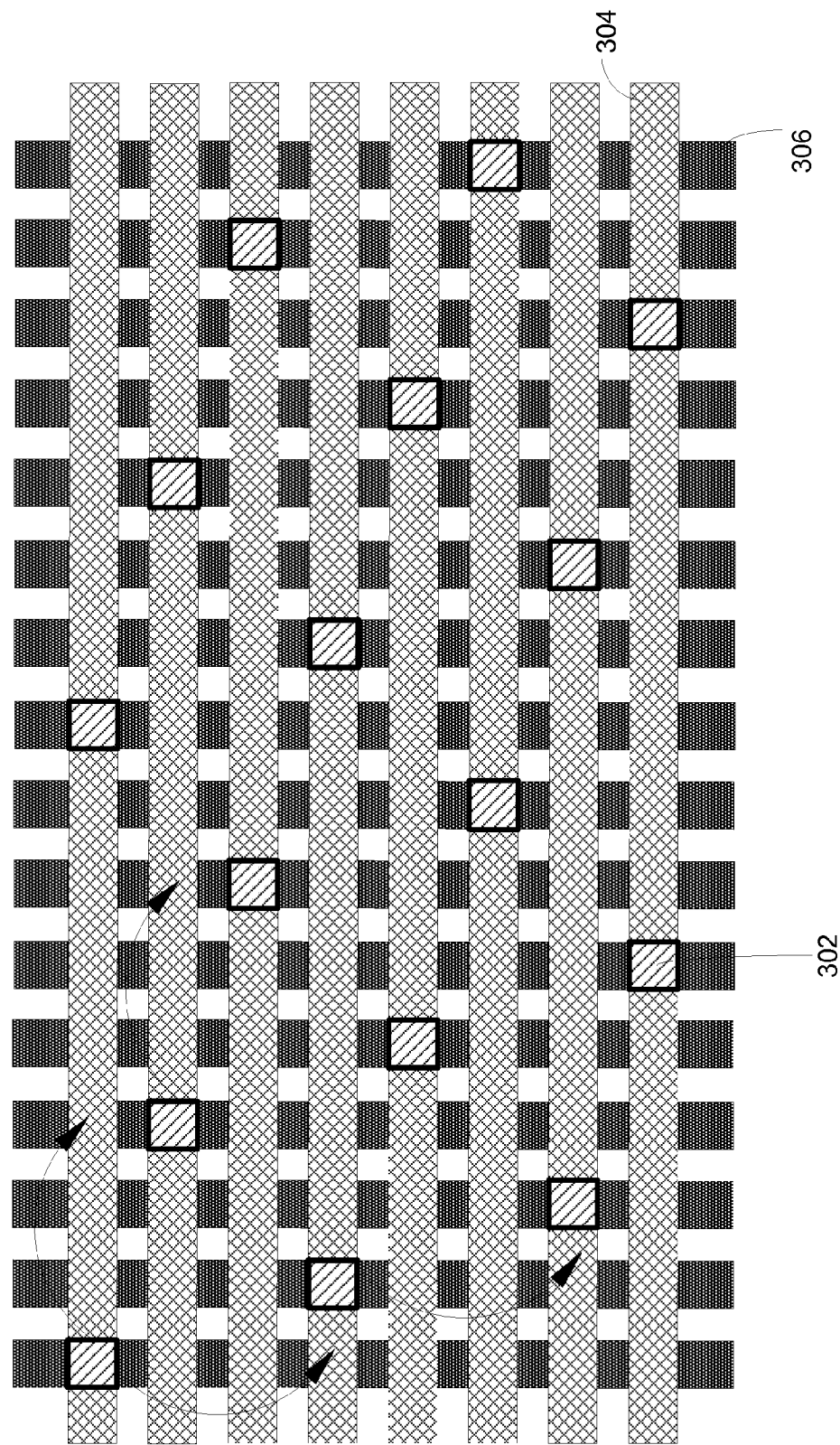
FIG. 3 illustrates an arrangement of vias relative to layers of patterned conductor layers for an array of memory cells, such that there are non-interfering via patterns on the mask that is used to create such via arrangement.

FIG. 3 illustrates an arrangement of vias relative to layers of patterned conductor layers for an array of memory cells, such that there are non-interfering via patterns on the mask that is used to create such via arrangement. The via arrangement includes vias 302 that extend to a first layer of patterned conductors 304 and a second layer of patterned conductors 306. The vias 302 can be positioned on the mask that defines the vias, such that OPC features of a via pattern do not overlap with OPC features of another via pattern. Therefore each via pattern with its via feature and the corresponding OPC features do not overlap with other via patterns with their via features and corresponding OPC features.

Figure 4:
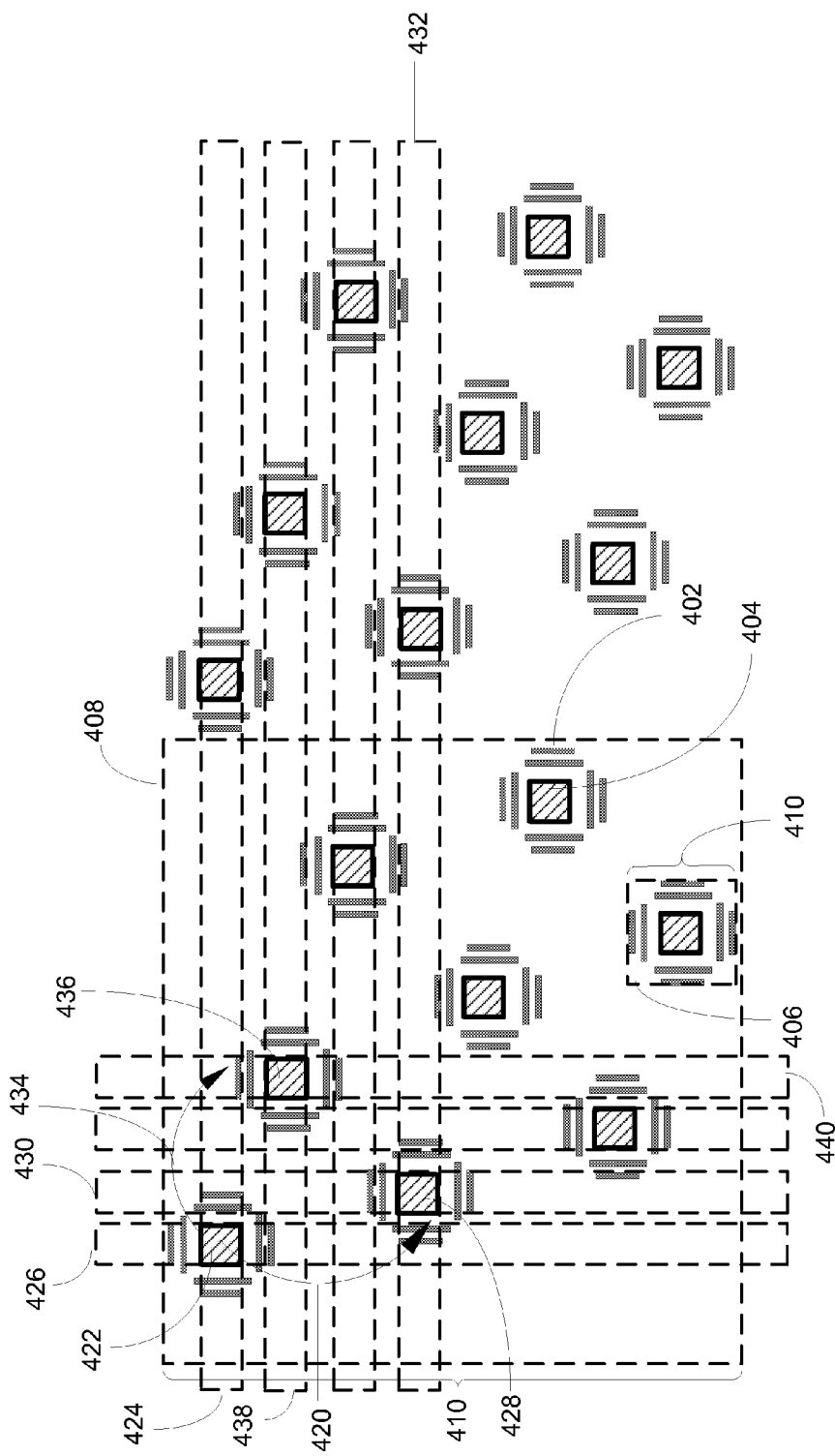
FIG. 4 illustrates a portion of the mask that is used to create the via arrangement shown in FIG. 3.

FIG. 4 shows a portion of the mask that is used to create the via arrangement shown in FIG. 3 with the via patterns spaced apart such that each via feature 404 and corresponding OPC feature 402, that make up a via pattern, do not overlap with other via features and corresponding OPC features. The mask includes a plurality of via patterns that create the via arrangement shown in FIG. 3. The plurality of via patterns can be made up of a repeated unit cell 408. The unit cell 408 is the via patterns on a portion of the mask that includes the smallest number of via patterns in the mask and corresponding via features that can be repeated to form the plurality of via patterns on the mask, or some number of via patterns larger than this smallest number. The unit cell can be repeated such that a first row of a first copy of the unit cell is adjacent to the last row of a second copy of the unit cell or such that the first column of the a first copy of the unit cell is adjacent to the last column of a second copy of the unit cell.

Referring back to FIG. 4, intersections of column positions and row positions determine possible positions of the via patterns on the mask that are made up of via features 404 and corresponding OPC features. Via patterns can be positioned in adjacent columns such that there is at least one intervening row between the rows in which the via patterns in adjacent columns are positioned in. Via patterns in adjacent columns are positioned in different row positions based upon a row integer difference D 420. The difference D 420 is equal to the via row pitch integer of R rows between via patterns in adjacent column positions. D 420 as shown in equation (1) can be the magnitude of the difference between the row position number of a first via pattern and the row position number of a second via pattern in an adjacent column.

$$D = |(\text{first via pattern row \#}) - (\text{second via pattern row \#})| \quad (1)$$

The row number and column number is defined as a numerical integer based upon the sequence of the rows and columns within the unit cell. The via patterns are positioned on the mask such that the via patterns that is in an adjacent column is not in an adjacent row. Therefore, D is an integer that is greater than zero. For example, as shown in FIG. 4, the first via feature 422 of the first via pattern is in the first row 424 with a row number one and the first column 426 with a first column number one. The second via feature 428 of the second via pattern is in the adjacent column 430 that has a column number two and in the fourth row 432 with a row number four. As such, D is three because the magnitude of the difference between the first via pattern row number, which is one, and the second via pattern row number, which is four, is three.

Alternatively, via patterns can be positioned in adjacent rows such that there is at least one intervening column between the columns in which the via patterns are positioned. Via patterns in adjacent rows can be positioned in different columns based upon a column integer difference D 434. The difference D 434 is equal to the via column pitch integer of C columns between via patterns that are positioned in adjacent rows. D 434, as shown in equation (2) can be the magnitude of the difference between the column position number of a first via pattern and the column position number of the second via pattern that is in an adjacent row.

$$D = |(\text{first via pattern column \#}) - (\text{second via pattern column \#})| \quad (2)$$

The row number and column number is defined as a numerical integer based upon the sequence of the rows and columns within the unit cell. The via patterns can be positioned such that a via pattern that is in an adjacent row relative to another via pattern is not in an adjacent column relative to another via pattern. For example, as shown in FIG. 4, the first via feature 422 of the first via pattern is in a first row 424 with a row number one and a first column 426 with a column number one. The second via feature 436 of the second via pattern, as is used for equation (2) is in an adjacent row 438 with a row number two and is in a column 440 with a column number four. As such, D is three because the magnitude of the difference between the first via pattern column number, which is one, and the second via pattern column number, which is four, is three.

Each unit cell 408 that forms the plurality of via patterns on the mask includes N via patterns on the mask. In order to position the via patterns on the mask such that the via feature and the corresponding OPC features that form each via pattern do not overlap on the mask when multiple unit cells are combined to form the plurality of via patterns, as is shown in FIG. 4, the division of the number of N via patterns within the unit cell by the column or row integer difference D, as previously described, can create a non-zero remainder, as is shown in equation (3). Specifically, the division of N by D produces a quotient Q and a remainder R, wherein R is a non-zero integer. When R is a non-zero integer, the vias features are not too close such that the OPC features associated with each via feature do not overlap.

$$N/D = Q + R, \text{ wherein } R \neq 0 \quad (3)$$

Ensuring that there is no overlap of the via features and OPC features on the mask creates a plurality of via patterns on the mask wherein each via feature and corresponding OPC feature is optically isolated from the other via features and the corresponding OPC features. Specifically, as shown by the mask in FIG. 4, the total number of N via patterns in a unit cell is eight. As described previously, the row integer difference D between via patterns in adjacent columns is three. Eight divided by three produces a remainder of two, which is a non-zero remainder. Therefore, as shown in FIG. 4, there is no overlap between any of the via features and the OPC features that form the via patterns in the mask and as such the via patterns are optically isolated from each other, even when a unit cell of the set of via patterns is repeated.

Additionally, while some of the via patterns of the plurality of via patterns can be positioned such that a row or column integer difference exists between the rows or columns that such via patterns are positioned in, according to the previous description, some of the via patterns of the plurality of via patterns can be positioned in rows and columns such that the number of rows or columns between adjacent patterns that define a row or column integer difference between such via patterns is less than the row or column integer difference of the via patterns positioned in accordance with the previous description. Specifically, some of the via patterns can be positioned such that when the number of N via patterns of the plurality of via patterns is divided by corresponding row or column integer difference of such via patterns, a zero remainder is created. Such zero remainder indicates that some of the via patterns are positioned in either adjacent columns or rows or both adjacent columns and rows.

Figure 5:
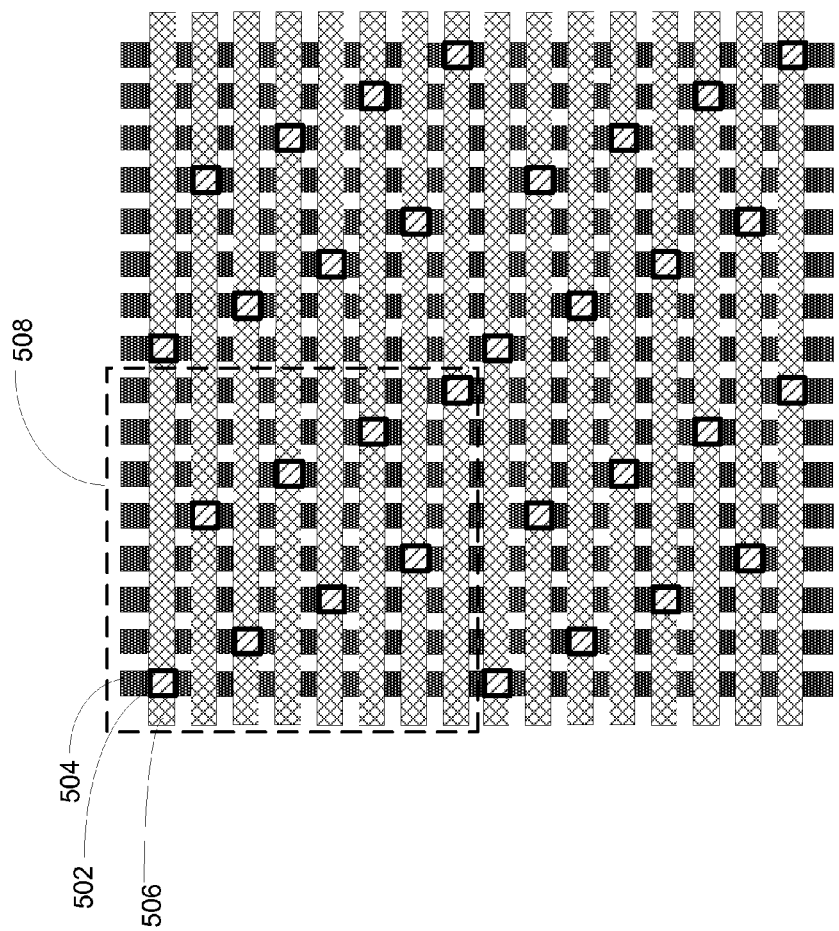
FIG. 5 illustrates an arrangement of vias relative to patterned conductor layers for an array of memory cells, whereby the mask that is used to create such arrangement includes a via pattern that is not optically isolated from a via pattern of a neighboring unit cell.
Figure 6:
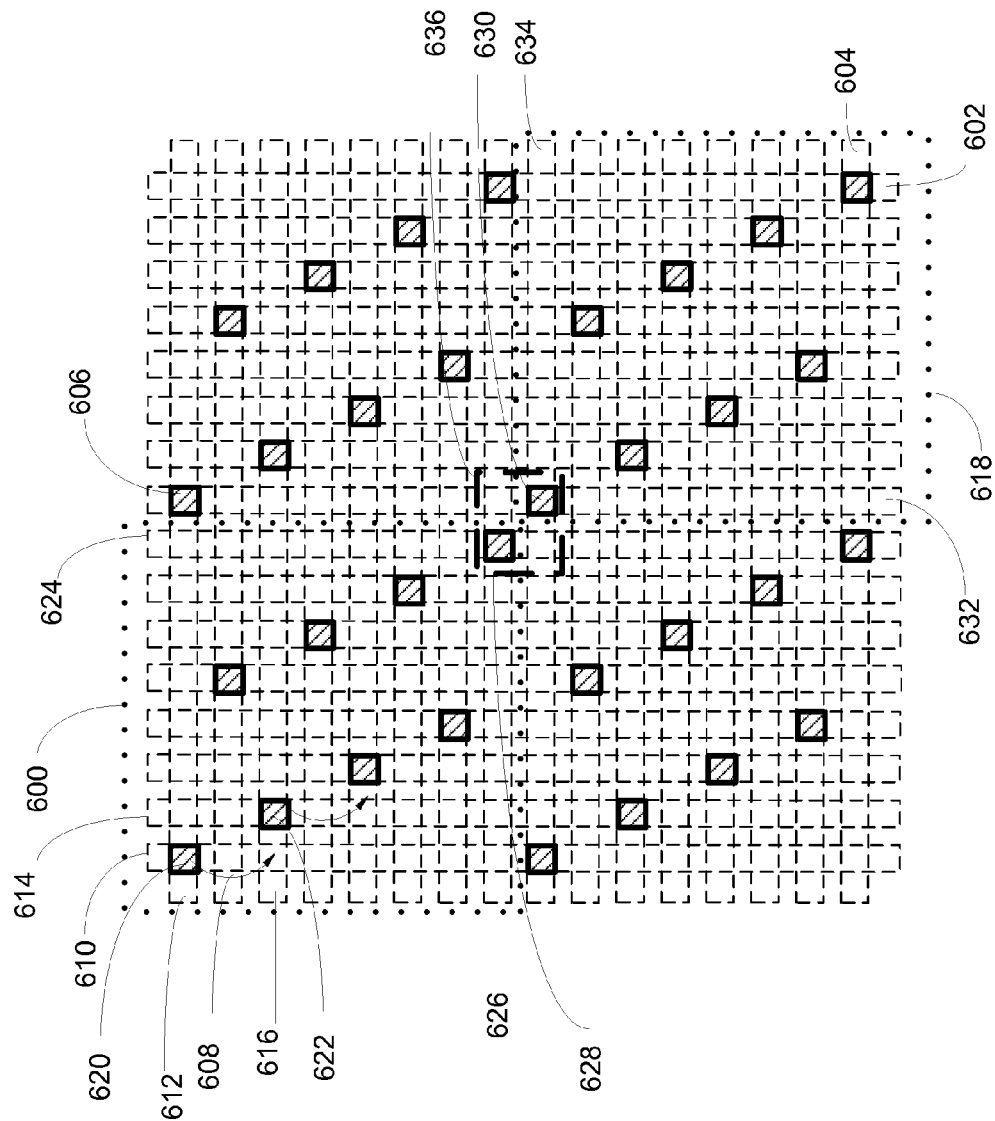
FIG. 6 illustrates the plurality of via patterns on a mask to create the via arrangement shown in FIG. 5.

FIG. 5 illustrates an arrangement of vias relative to patterned conductor layers for an array of memory cells, whereby the mask that is used to create such arrangement includes a via pattern that is not optically isolated from a via pattern of a neighboring unit cell. FIG. 6 illustrates the plurality of via patterns in the mask that is used to create the via arrangement shown in FIG. 5. For ease in showing the mask of FIG. 6, the OPC features of the plurality of via patterns are not shown, although such OPC features are actually included. When a row integer difference D, as previously defined, is divided into the number N of via patterns per unit cell, as is shown in equation (3), and a remainder of zero exists, then there are via features and associated OPC features in the plurality of via patterns on the mask that are not optically isolated such that there is overlap via patterns on the mask.

Specifically, the via arrangement illustrated in FIG. 5 includes vias 502. Such vias 502 extend to a first layer of patterned conductors 504 and a second layer of patterned conductors 506. The portion of the arrangement of vias includes an area 508 that is repeated four times in creating the portion of the arrangement of vias shown in FIG. 5. Such area 508 corresponds to the unit cell of the plurality of via patterns on the mask that is shown in FIG. 6.

In FIG. 6 the mask includes via patterns that define the vias on the wafer. Each via feature 606 combines with the associated OPC features (not shown in FIG. 6) to form a via pattern. The mask also includes a unit cell 600 that is repeated to form the plurality of via patterns on the mask. As with previous examples, each unit cell 600 is the smallest number of via patterns in an area on the mask that can be repeated to form the plurality of via patterns in the mask. Furthermore, as with previous examples, the positioning of the via patterns define the row positions 602 and column positions 604 within the mask.

The via patterns in adjacent columns are separated by a row integer difference D 608. As previously described the row integer difference D 608 is the magnitude of the difference between the row position number of a first via feature 620 of a first via pattern and the row position number of a second via feature 622 of a second via pattern in an adjacent column within the unit cell 600. Such row and column position numbers are defined by a numerical integer that corresponds to the sequential placement of the rows and columns within the unit cell 600. In the unit cell shown in FIG. 6, the first via feature 620 of the first via pattern is in the first column position 610 and the first row position 612 of the unit cell. The second via feature 622 of the second via pattern is in the adjacent second column 614 and the third row position 616. Based on the method of calculating D, as illustrated in equation (1) as the magnitude of the difference of the row position numbers, the magnitude of the difference of the row position numbers of the first via pattern and the second via pattern is three minus one, which is equal to two.

As a result, when the total number of N via patterns in the unit cell, which is eight, is divided by the value D of two, there is a remainder of zero. As such, there is an overlap of via patterns between neighboring unit cells. Such overlap is between the OPC features that are in the area 636 on the mask. Area 636 includes a via feature 628 of a via pattern in the first unit cell that is located in the column 624 with a column number eight and the row 626 with a row number eight.

The area 636 also includes a via feature 630 of a via pattern that is in the fourth repeated unit cell 618. Such via feature 630 of the via pattern in the fourth repeated unit cell is located in the column 632 of the fourth repeated unit cell 618 that has a column number of one. Such via feature 630 of the via pattern in the fourth repeated unit cell is in the row 634 of the fourth repeated unit cell that has a row number of one. The column 632 that has a column number of one in the fourth unit cell is adjacent to the column 624 that has a column number of eight in the first unit cell 600. The row 634 that has a row number of one in the fourth repeated unit cell is adjacent to the row 626 that has a row number of eight in the first unit cell 600. As a result, in the plurality of via patterns on the mask the via pattern with the via feature 630 is adjacent to the via pattern with via feature 628. Therefore, there is overlap between the OPC features of the via patterns that have via features 628 and 630. Therefore optical isolation does not exist between the via patterns in the area 636 of the mask. Optical isolation is accomplished for the purposes of the present application when features formed on the wafer using the features on the mask are not noticeably distorted as a result of interaction of the electromagnetic radiation pattern that is created by the illumination of one feature on the mask with the electromagnetic radiation pattern that is created by the illumination of another feature on the mask. As such, optical isolation is not created on the mask for every via pattern that is used to create the via arrangement shown in FIG. 5.

Referring back to FIG. 4, a portion of the mask with via features and OPC features creates the via arrangement that is shown in FIG. 3. Each via feature and the associated OPC features form a via pattern that defines an area 406 on the mask that is a square. The unit cell 408, as discussed previously includes the smallest number of N via patterns within the area defined by the unit cell that can be repeated on the mask in order to create the via arrangement shown in FIG. 3. Each unit cell can be a square with a side length L 410. The number of N via patterns in the unit cell is the number of columns on the mask that is defined by the positioning of the via patterns in forming vias. The side length L 410 of the unit cell, as shown in equation (4), is the number of N via patterns within the unit cell multiplied by either the column pitch or the row pitch p.

$$L=Np \quad (4)$$

As the unit cell can be a square, the total area A of the unit cell is the side length L squared. Since the side length is equal to the product of the number of N via patterns in the unit cell and either the row or column pitch p the total area A of the unit cell, as shown in equation (5), is the number of N via patterns squared multiplied by the row or column pitch p squared.

$$A=L^2=N^2p^2 \quad (5)$$

Each area a 406 that is defined by the via pattern is a square, such area 406 can be expressed as the total area of the unit cell divided by the number of N via patterns within the unit cell. As the total area of the unit cell is the number of N via patterns squared multiplied by the row or column pitch squared, dividing the total area of the unit cell by the number of N via patterns leaves the total number of N via patterns multiplied by the row pitch or column pitch p squared. Therefore, the area a 406 of a via pattern, as is shown in equation (6), is the product of the number of N via patterns and associated via patterns within the unit cell and the row pitch or column pitch, p, squared.

$$a = \frac{A}{N} = \frac{N^2 p^2}{N} = Np^2 \qquad (6)$$

The area a 406 is a square with side length l 410. Since such area is a square, the side length l 410, as is shown in equation (7) of such area a is the square root of the area. As the area a is the product of the number of N via patterns in the unit cell and the row pitch or column pitch p squared, the square root of such area is the square root of N via patterns in the unit cell multiplied by the row pitch or column pitch p. Therefore the length l of the sides 410 of the area a that is defined by the via pattern that is made up of a via feature and the associated OPC features is the product of the square root of N via patterns in the unit cell and the row pitch or column pitch p.

$$l = \sqrt{a} = \sqrt{Np^2} = p\sqrt{N} \qquad (7)$$

Based upon the expression of the side length l of the area a that is defined by the via pattern as a function of the row pitch or column pitch and the number of N via patterns in the unit cell, as is shown in equation (7), the desired length of the square that defines such area a can be the neighboring integer of the square root of the number of N via features and associated via patterns multiplied by the row pitch or column pitch p. The neighboring integer is at least equal to one of the via row pitch integer or the via column pitch integer that, as previously described, define the row or column integer difference D. Therefore, in order to ensure that the via patterns do not overlap, the OPC feature and via feature can be of a size such that the area that they define is equal to the neighboring integer of the square root of the number of N via features and associated via patterns in the unit cell multiplied by the row pitch or column pitch p. As a result, the OPC features and the via feature can be sized on the mask based upon the neighboring integer of the square root of N, such that there is no overlap between the via patterns on the mask. Such neighboring integer can be the nearest higher integer when the square root of N is rounded up or can be the nearest lower integer when the square root of N is rounded down. Additionally, since the columns and rows are defined by via patterns on the mask, the size of the via patterns can determine the spacing and subsequent pitch of the rows and columns. Furthermore, such neighboring integer can be equal to at least one of the row and column integer difference.

As shown in FIG. 4, the unit cell 408 includes eight via features and associated OPC features that combine to form 8 via patterns, such that N is eight. Specifically, for the unit cell of the mask shown in FIG. 4, since there are eight via patterns within the unit cell, the length l of the area a that is defined by the via feature 404 and the associated OPC features 402, based upon equation (7), is equal to the square root of eight times the row or column pitch p. Therefore, the neighboring integer of the square root of eight times the row pitch and product pitch p, as previously described, can be used to calculate the length of the side l of the area a defined by the via feature and the associated OPC features. As a result, the OPC features and the via feature can be sized based upon the product of the neighboring integer of the square root of eight and the row or column pitch p such that there is no overlap between the via patterns on the mask. Subsequently, the row or column pitch integer difference can be equal to such neighboring integer.

Figure 7A:
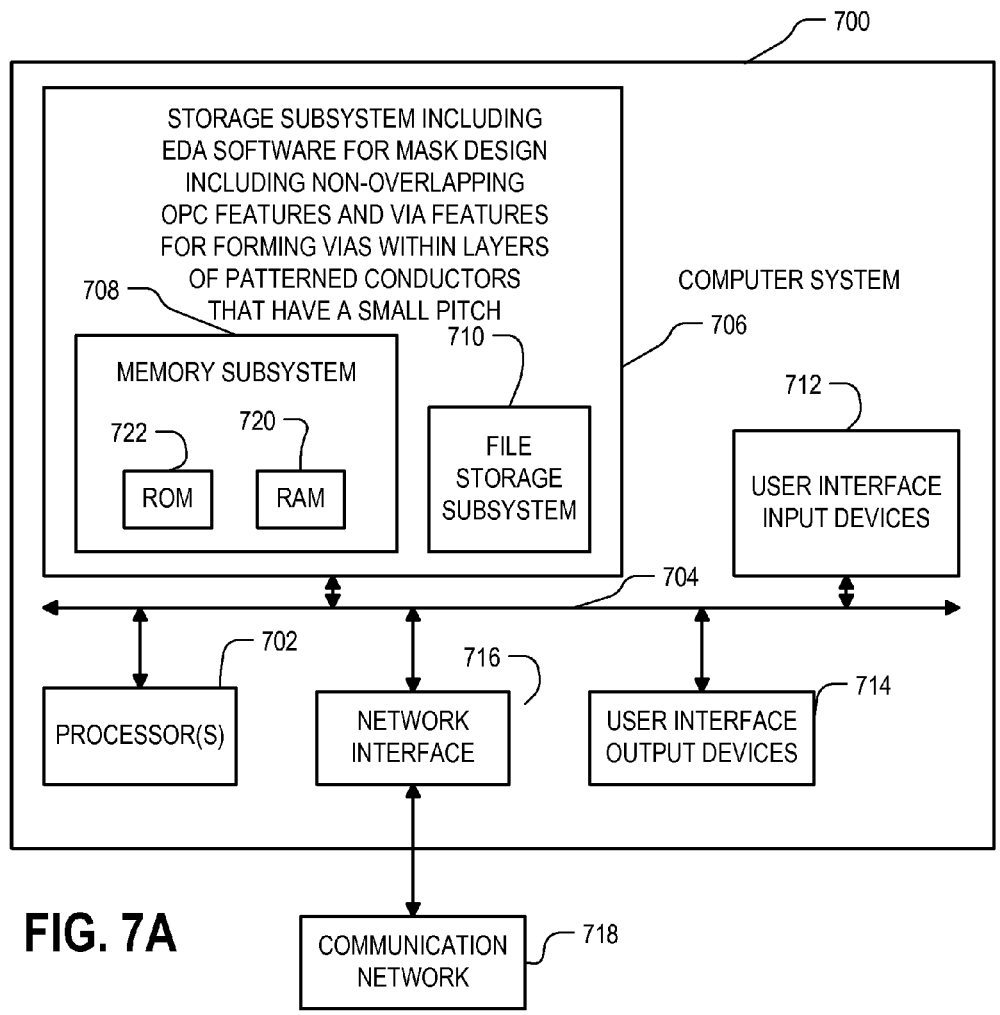

FIGS. 7A and 7B illustrate a computer system and a memory for creating the mask that creates an arrangement of vias in an integrated circuit that has patterned conductor layers that have a small pitch, shown in FIG. 7C, such that there are non-overlapping via patterns on the mask, shown in FIG. 7D. Computer system 700 typically includes at least one processor 702 which communicates with a number of peripheral devices via bus subsystem 704. These peripheral devices may include a storage subsystem 706, comprising a memory subsystem 708 and a file storage subsystem 710, user interface input devices 712, user interface output devices 714, and a network interface subsystem 716. The input and output devices allow user interaction with computer system 700. Network interface subsystem 716 provides an interface to outside networks, including an interface to communication network 718, and is coupled through communication network 718 to corresponding interface devices in other computer systems. Communication network 718 may comprise many interconnected computer systems and communication links. These communication links may be wireline links, optical links, wireless links, or any other mechanisms for communication of information. While in one embodiment, communication network 718 is the Internet, communication network 718 may be any suitable computer network.

User interface input devices 712 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 700 or onto communication network 718.

User interface output devices 714 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 600 to the user or to another machine or computer system.

Storage subsystem 706 stores the basic programming and data constructs that provide the functionality of some or all of the EDA tools in positioning via patterns on the mask such that the via patterns do not overlap. These software modules are generally executed by processor 702.

Memory subsystem 708 typically includes a number of memories including a main random access memory (RAM) 720 for storage of instructions and data during program execution and a read only memory (ROM) 722 in which fixed instructions are stored. File storage subsystem 710 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 710.

Bus subsystem 704 provides a mechanism for letting the various components and subsystems of computer system 700 communicate with each other as intended. Although bus subsystem 704 is shown schematically as a single bus, alternative embodiments of the bus subsystem may use multiple busses.

Computer system 700 itself can be of varying types including a personal computer, a portable computer, a workstation, a computer terminal, a network computer, a television, a mainframe, or any other data processing system or user device. Due to the ever-changing nature of computers and networks, the description of computer system 700 depicted in FIG. 7A is intended only as a specific example for purposes of illustrating the preferred embodiments. Many other configurations of computer system 700 are possible having more or less components than the computer system depicted in FIG. 7A.

FIG. 7B shows a memory 724 such as a non-transitory, computer readable data storage medium associated with file storage subsystem 710, and/or with network interface subsystem 716 can include a data structure specifying a circuit design that includes a via arrangement such that there are non-overlapping via patterns on the mask. The memory 724 can be a hard disk, a floppy disk, a CD-ROM, an optical medium, removable media cartridge, or other medium that stores computer readable data in a volatile or non-volatile form. The memory 724 is shown storing a circuit design 726 that includes one or more via arrangements such that there are non-overlapping via patterns on the masks that are used to create such via arrangements, and/or EDA instructions that position via patterns according to the methods as described herein.

FIG. 7D is a block representing a mask 730 that is created from the stored circuit design 726 that includes a via arrangement such that there are non-overlapping via patterns on the mask that is used to create such arrangement, in accordance with the described technology. FIG. 7C is a block representing an integrated circuit 728 created with the mask 730. The integrated circuit 728 has a via arrangement such that there are non-overlapping via patterns on the mask that is used to create such via arrangement in accordance with the described technology.

Figure 8:
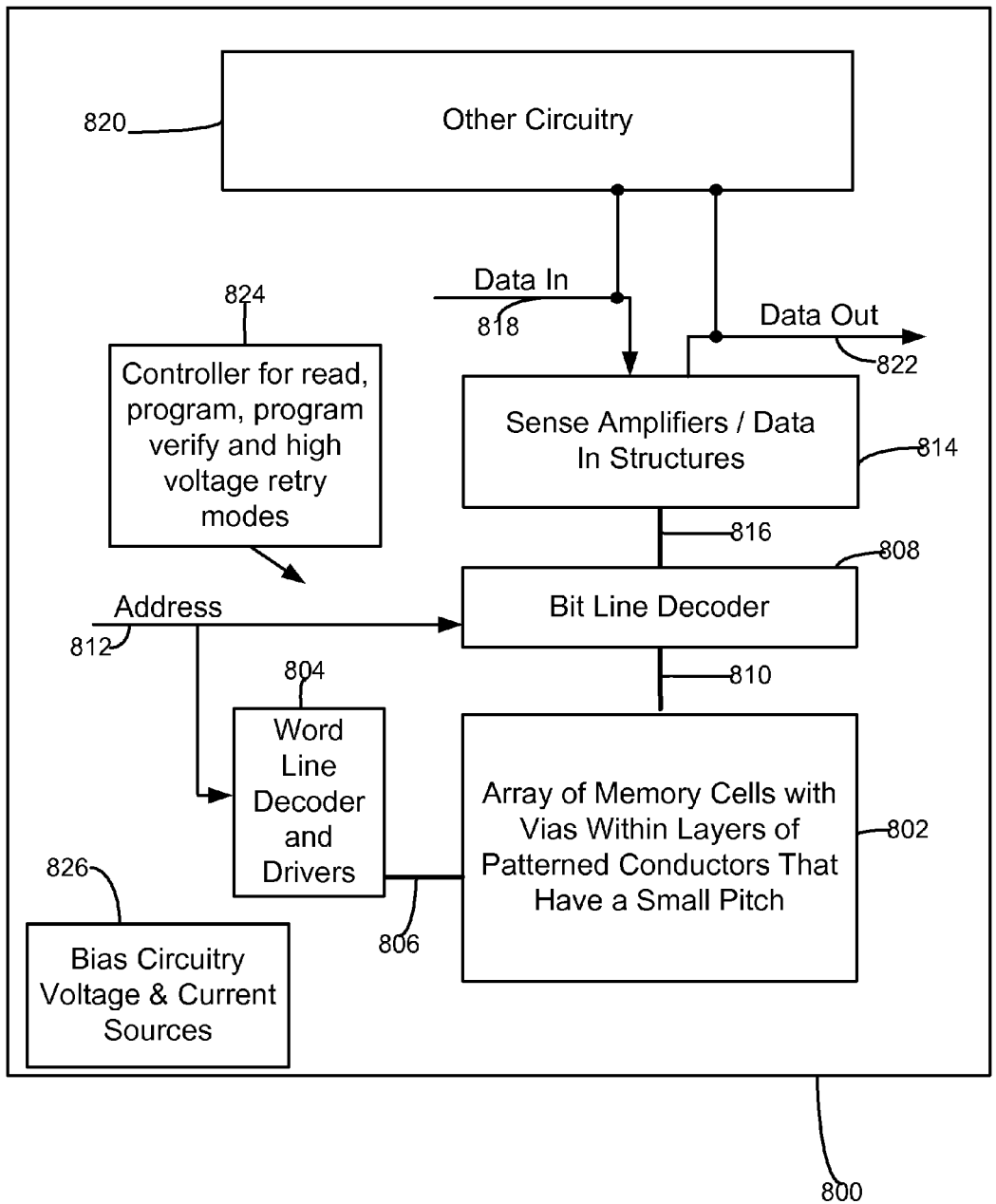
FIG. 8 is a simplified block diagram of an integrated circuit including a memory array of memory cells and vias between patterned conductor layers that have a small pitch between conductors.

FIG. 8 is a simplified block diagram of an integrated circuit including a memory array of memory cells and vias between patterned conductor layers that have a small pitch between conductors. The integrated circuit 800 includes an array 802 of memory cells. A word line decoder 804 coupled to and in electrical communication with a plurality of word lines 806 arranged along rows in the memory array 802. A bit line (column) decoder 808 is in electrical communication with a plurality of bit lines 810 arranged along columns in the array 802 for reading and programming the memory cells in the memory array 802. The plurality of bit lines are formed from a plurality of conductive lines that are each formed within a trench and coupled to stacks of memory cells that are adjacent to the sides of each conductive line. Addresses are supplied on bus 812 to word line decoder and drivers 804 and bit line decoder 808. Sense amplifiers and data-in structures in block 814, including voltage and/or current sources for the read, program, program verify and high voltage program retry modes are coupled to bit line decoder 808 via data bus 816. Data is supplied via a data-in line 818 from input/output ports on integrated circuit 800, or from other data sources internal or external to integrated circuit 800, to data-in structures in block 814. Other circuitry 820 may be included on integrated circuit 800, such as a general purpose processor or special purpose application circuitry, or a combination of modules providing system-on-a-chip functionality supported by array 802. Data is supplied via a data-out line 822 from the sense amplifiers in block 814 to input/output ports on integrated circuit 800, or to other data destinations internal or external to integrated circuit 800.

The integrated circuit in FIG. 8 can for example include an array of memory cells, in which the bit lines or word lines, or other conductors are connected by interlayer connectors to other features of the integrated circuit using a via pattern as described above. Thus the circuit can have a plurality of layers of patterned conductors, and a plurality of N interlayer connectors, the plurality of N interlayer connectors forming connections to conductors in a layer of patterned conductors. The plurality of interlayer connectors can be arranged in R rows and C columns, a first integer difference between rows of interlayer connectors in adjacent columns is equal to a via row integer difference of R rows, and a second integer difference between columns of interlayer connectors in adjacent rows is equal to a via column integer difference of C columns, wherein an integer D is equal to one of:

(i) a square root of an integer N of the number of interlayer connectors, rounded up to a nearest higher integer; and (ii) the square root of the integer N of the number of the interlayer connectors, rounded down to a nearest lower integer; and the integer D also equal to at least one of the row integer difference of R rows and the column integer difference of C columns.

A controller 824 implemented in this example using a bias arrangement state machine, includes logic which controls the application of bias circuitry voltage and current sources 826 for the application of bias arrangements described herein. Controller 824 may be implemented using special-purpose logic circuitry as known in the art. In alternative embodiments, controller 824 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 824.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A lithographic mask comprising:
a plurality of via patterns on a mask defining a plurality of vias on a wafer, the plurality of via patterns having via locations on the mask at particular intersections of a set of neighboring via row positions having a row pitch on the mask and a set of neighboring via column positions having a column pitch on the mask, via patterns in the plurality of via patterns including combinations of via features and optical proximity correction features for the via features, the combinations having a length on the mask greater than the column pitch and a width on the mask greater than the row pitch, and the via patterns in the plurality of via patterns are non-overlapping with other via patterns in the plurality of via patterns,
wherein a first integer difference between rows of the via locations in adjacent columns of the set of neighboring via column positions is equal to a via row pitch integer of R rows, and a second integer difference between columns of the via locations in adjacent rows of the set of neighboring via row positions is equal to a via column pitch integer of C columns, wherein an integer D is equal to one of:
(i) a square root of an integer N of the number of the plurality of via patterns, rounded up to a nearest higher integer; and (ii) the square root of the integer N of the number of the plurality of via patterns, rounded down to a nearest lower integer, and the integer D is equal to at least one of the via row pitch integer of R rows and the via column pitch integer of C columns.

2. The mask of claim 1, wherein a first integer difference between rows of the via locations in adjacent columns of the set of neighboring via column positions is equal to a via row pitch integer of R rows, and a second integer difference between columns of the via locations in adjacent rows of the set of neighboring via row positions is equal to a via column pitch integer of C columns, and wherein via locations in the adjacent columns include a first via location at a first row and a second via location at a second row, and responsive to fewer than the via row pitch integer of R rows being positioned between the first row and a first end of the set of neighboring via row positions, and fewer than the via row pitch integer of R rows being positioned between the second row and a second end of the set of neighboring via row positions, the via pitch integer of R rows is counted from the first row to the first end of the set of neighboring via row positions and from the second row to the second end of the set of neighboring via row positions.

3. The mask of claim 1, wherein a unit cell includes the plurality of via cells having a set of relative positions with respect to each other, and the mask further comprising an additional plurality of via patterns included in a copy of the unit cell, the additional plurality of via patterns having additional via locations determined by positioning of the copy of the unit cell, wherein a zero remainder results from at least one of:
(i) an integer N of the number of the plurality of via patterns divided by the via row pitch integer of R rows, and
(ii) the integer N of the number of the plurality of via patterns divided by the column pitch integer of C columns, and
the zero remainder indicates that, responsive to the unit cell and the copy of the unit cell having adjacent positions, a first via location of the via locations in the unit cell and a second via location of the additional via locations in the copy of the unit cell are in adjacent rows of the set of neighboring via row positions and adjacent columns of the set of neighboring via column positions.

4. The mask of claim 1, wherein a unit cell includes the plurality of via cells having a set of relative positions with respect to each other, and the mask further comprising an additional plurality of via patterns included in a copy of the unit cell, the additional plurality of via patterns having additional via locations determined by positioning of the copy of the unit cell, wherein a nonzero remainder results from at least one of:
(i) an integer N of the number of the plurality of via patterns divided by the via row pitch integer of R rows, and
(ii) the integer N of the number of the plurality of via patterns divided by the column pitch integer of C columns, and
the nonzero remainder indicates that, responsive to the unit cell and the copy of the unit cell having adjacent positions, the via locations in the unit cell and the additional via locations in the copy of the unit cell are spaced apart by one or more of: (i) at least one intervening row of the set of neighboring via row positions, and (ii) at least one intervening column of the set of neighboring via column positions.

5. The mask of claim 1, wherein the optical proximity correcting features include scattering bars.

6. A method of making an integrated circuit layout with an EDA tool, comprising:
positioning, with a computer system executing the EDA tool, a plurality of via patterns on a design to manufacture a mask defining a plurality of vias on a wafer, the plurality of via patterns having via locations on the mask at particular intersections of a set of neighboring via row positions having a row pitch on the mask and a set of neighboring via column positions having a column pitch on the mask, via patterns in the plurality of via patterns including combinations of via features and optical proximity correction features for the via features, the combinations having a length greater than the column pitch and a width greater than the row pitch, and the via patterns in the plurality of via patterns are non-overlapping with other via patterns in the plurality of via patterns, wherein a first integer difference between rows of the via locations in adjacent columns of the set of neighboring via column positions is equal to a via row pitch integer of R rows, and a second integer difference between columns of the via locations in adjacent rows of the set of neighboring via row positions is equal to a via column pitch integer of C columns, wherein an integer D is equal to one of:
(i) a square root of an integer N of the number of the plurality of via patterns, rounded up to a nearest higher integer; and
(ii) the square root of the integer N of the number of the plurality of via patterns, rounded down to a nearest lower integer, and
the integer D is equal to at least one of the via row pitch integer of R rows and the via column pitch integer of C columns.

7. The method of claim 6, wherein a first integer difference between rows of the via locations in adjacent columns of the set of neighboring via column positions is equal to a via row pitch integer of R rows, and a second integer difference between columns of the via locations in adjacent rows of the set of neighboring via row positions is equal to a via column pitch integer of C columns, and wherein via locations in the adjacent columns include a first via location at a first row and a second via location at a second row, and responsive to fewer than the via row pitch integer of R rows being positioned between the first row and a first end of the set of neighboring via row positions, and fewer than the via row pitch integer of R rows being positioned between the second row and a second end of the set of neighboring via row positions, the via pitch integer of R rows is counted from the first row to the first end of the set of neighboring via row positions and from the second row to the second end of the set of neighboring via row positions.

8. The method of claim 6, wherein a unit cell includes the plurality of via cells having a set of relative positions with respect to each other, and the method further comprising an additional plurality of via patterns included in a copy of the unit cell, the additional plurality of via patterns having additional via locations determined by positioning of the copy of the unit cell, wherein a zero remainder results from at least one of:
(i) an integer N of the number of the plurality of via patterns divided by the via row pitch integer of R rows, and
(ii) the integer N of the number of the plurality of via patterns divided by the column pitch integer of C columns, and
the zero remainder indicates that, responsive to the unit cell and the copy of the unit cell having adjacent positions, a first via location of the via locations in the unit cell and a second via location of the additional via locations in the copy of the unit cell are in adjacent rows of the set of neighboring via row positions and adjacent columns of the set of neighboring via column positions.

9. The method of claim 6, wherein a unit cell includes the plurality of via cells having a set of relative positions with respect to each other, and the method further comprising an additional plurality of via patterns included in a copy of the unit cell, the additional plurality of via patterns having additional via locations determined by positioning of the copy of the unit cell, wherein a nonzero remainder results from at least one of:
(i) an integer N of the number of the plurality of via patterns divided by the via row pitch integer of R rows, and
(ii) the integer N of the number of the plurality of via patterns divided by the column pitch integer of C columns, and the nonzero remainder indicates that, responsive to the unit cell and the copy of the unit cell having adjacent positions, the via locations in the unit cell and the additional via locations in the copy of the unit cell are spaced apart by one or more of: (i) at least one intervening row of the set of neighboring via row positions, and (ii) at least one intervening column of the set of neighboring via column positions.

10. The method of claim 6, wherein the optical proximity correcting features include scattering bars.

11. A non-transitory computer readable medium having EDA tool software stored thereon for positioning vias within an integrated circuit layout, comprising:

instructions in the EDA tool which when executed by a computer perform positioning a plurality of via patterns on a design to manufacture a mask defining a plurality of vias on a wafer, the plurality of via patterns having via locations on the mask at particular intersections of a set of neighboring via row positions having a row pitch on the mask and a set of neighboring via column positions having a column pitch on the mask, via patterns in the plurality of via patterns including combinations of via features and optical proximity correction features for the via features, the combinations having a length greater than the column pitch and a width greater than the row pitch, and the via patterns in the plurality of via patterns are non-overlapping with other via patterns in the plurality of via patterns, wherein a first integer difference between rows of the via locations in adjacent columns of the set of neighboring via column positions is equal to a via row pitch integer of R rows, and a second integer difference between columns of the via locations in adjacent rows of the set of neighboring via row positions is equal to a via column pitch integer of C columns, wherein an integer D is equal to one of:

(i) a square root of an integer N of the number of the plurality of via patterns, rounded up to a nearest higher integer; and
(ii) the square root of the integer N of the number of the plurality of via patterns, rounded down to a nearest lower integer; and
the integer D is equal to at least one of the via row pitch integer of R rows and the via column pitch integer of C columns.

12. The medium of claim 11, wherein a first integer difference between rows of the via locations in adjacent columns of the set of neighboring via column positions is equal to a via row pitch integer of R rows, and a second integer difference between columns of the via locations in adjacent rows of the set of neighboring via row positions is equal to a via column pitch integer of C columns, and wherein via locations in the adjacent columns include a first via location at a first row and a second via location at a second row, and responsive to fewer than the via row pitch integer of R rows being positioned between the first row and a first end of the set of neighboring via row positions, and fewer than the via row pitch integer of R rows being positioned between the second row and a second end of the set of neighboring via row positions, the via pitch integer of R rows is counted from the first row to the first end of the set of neighboring via row positions and from the second row to the second end of the set of neighboring via row positions.

13. The medium of claim 11, wherein a unit cell includes the plurality of via cells having a set of relative positions with respect to each other, and the medium further comprising an additional plurality of via patterns included in a copy of the unit cell, the additional plurality of via patterns having additional via locations determined by positioning of the copy of the unit cell, wherein a zero remainder results from at least one of:
(i) an integer N of the number of the plurality of via patterns divided by the via row pitch integer of R rows, and
(ii) the integer N of the number of the plurality of via patterns divided by the column pitch integer of C columns, and the zero remainder indicates that, responsive to the unit cell and the copy of the unit cell having adjacent positions, a first via location of the via locations in the unit cell and a second via location of the additional via locations in the copy of the unit cell are in adjacent rows of the set of neighboring via row positions and adjacent columns of the set of neighboring via column positions.

14. The medium of claim 11, wherein a unit cell includes the plurality of via cells having a set of relative positions with respect to each other, and the medium further comprising an additional plurality of via patterns included in a copy of the unit cell, the additional plurality of via patterns having additional via locations determined by positioning of the copy of the unit cell, wherein a nonzero remainder results from at least one of:
(i) an integer N of the number of the plurality of via patterns divided by the via row pitch integer of R rows, and
(ii) the integer N of the number of the plurality of via patterns divided by the column pitch integer of C columns, and the nonzero remainder indicates that, responsive to the unit cell and the copy of the unit cell having adjacent positions, the via locations in the unit cell and the additional via locations in the copy of the unit cell are spaced apart by one or more of: (i) at least one intervening row of the set of neighboring via row positions, and (ii) at least one intervening column of the set of neighboring via column positions.

15. The medium of claim 11, wherein the optical proximity correcting features include scattering bars.

* * * * *